Figure 1:
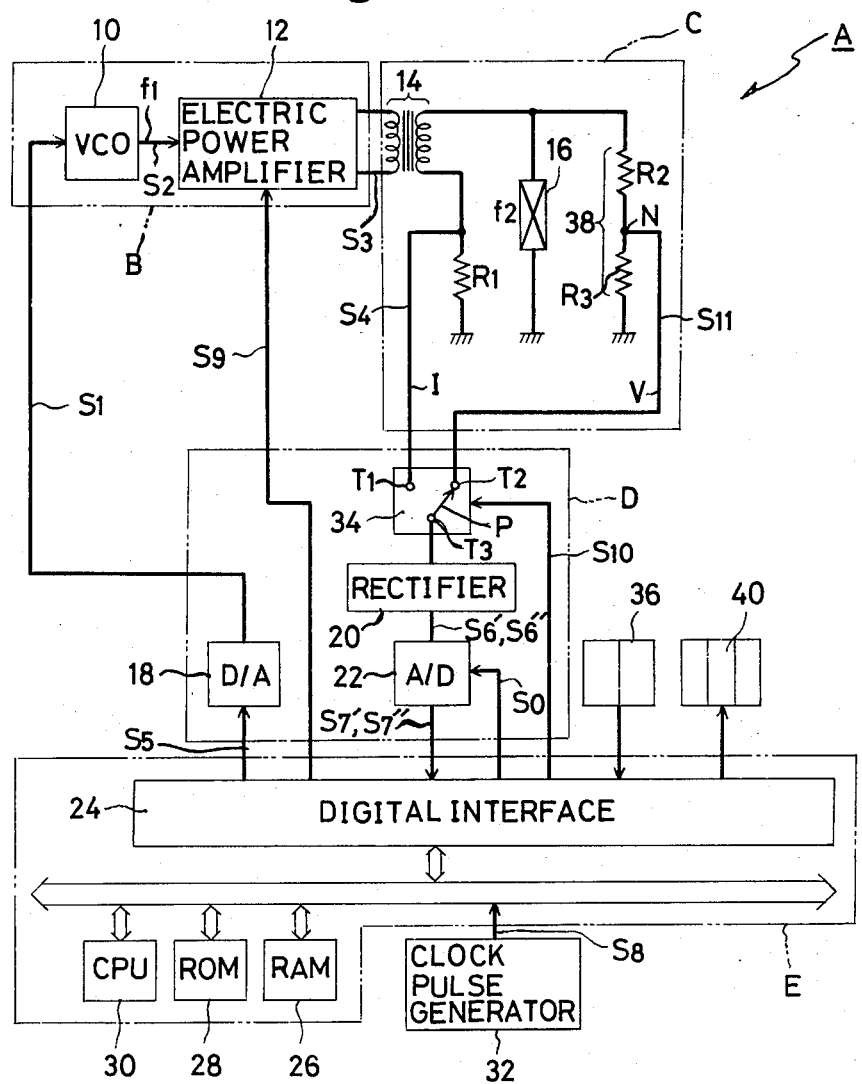

United States Patent [19]

Nakamura

[11] Patent Number: 4,623,838

[45] Date of Patent: Nov. 18, 1986

[54] ANALOG-DIGITAL CONVERSION CIRCUIT APPARATUS CONNECTABLE TO A MICROCOMPUTER FOR MEASURING ELECTRIC VOLTAGE AND CURRENT OF A VIBRATOR OF AN ULTRASONIC WAVE OSCILLATOR

[75] Inventor: Masahiro Nakamura, Tokyo, Japan

[73] Assignee: Ohtake Works Company, Ltd., Tokyo, Japan

[21] Appl. No.: 723,834

[22] Filed: Apr. 16, 1985

Related U.S. Application Data

[62] Division of Ser. No. 412,221, Aug. 27, 1982, Pat. No. 4,525,790.

[30] Foreign Application Priority Data

Aug. 28, 1981 [JP] Japan .............................. 56-134249

[51] Int. Cl.$^4$ ............................................ G01R 21/06
[52] U.S. Cl. ...................................... 324/142; 324/119; 364/483
[58] Field of Search .................... 324/142, 119, 103 P; 364/483, 754, 508; 328/160; 73/602, 646

[56] References Cited

U.S. PATENT DOCUMENTS

| | | | |
|---|---|---|---|
| 3,764,908 | 10/1973 | Elms | 324/142 |
| 4,106,095 | 8/1978 | Yarbrough | 364/483 X |
| 4,156,187 | 5/1979 | Murray et al. | 324/142 |
| 4,240,149 | 12/1980 | Fletcher et al. | 364/483 |

FOREIGN PATENT DOCUMENTS 0049180  4/1979  Japan .................................. 324/142

Primary Examiner—Stewart J. Levy
Assistant Examiner—Stephen M. Baker
Attorney, Agent, or Firm—Patrick H. Hume

[57] ABSTRACT

An analog-digital conversion circuit apparatus connectable to a microcomputer for measuring electric voltage and current of a vibrator of an ultrasonic wave oscillator is disclosed. An analog high-frequency wave voltage value signal and an analog high-frequency wave current value signal acquired from a vibration system are alternately input to a conversion-transmission section. A digital high-frequency wave voltage value signal and a digital high-frequency wave current value signal, which have been converted in the conversion-transmission section, are transmitted to the microcomputer for various uses connected with the electric voltage and current of the vibrator of the ultrasonic wave oscillator.

2 Claims, 2 Drawing Figures

---

ANALOG-DIGITAL CONVERSION CIRCUIT APPARATUS CONNECTABLE TO A MICROCOMPUTER FOR MEASURING ELECTRIC VOLTAGE AND CURRENT OF A VIBRATOR OF AN ULTRASONIC WAVE OSCILLATOR

This application is a division of Application Ser. No. 412,221, filed Aug. 27, 1982, U.S. Pat. No. 4,525,790, for Method and Means for Measuring Electric Power Consumption of a Vibrator of an Ultrasonic Wave Oscillator, which, in turn, is based on Japanese priority application No. 56-134249, filed Aug. 28, 1981. On Aug. 27, 1982, when the parent application of the present divisional case was filed, a companion application, Ser. No. 412,274, was also filed by the same inventor and assignee, entitled Method for Oscillating Ultrasonic Waves and a Built-In Ultrasonic Wave Oscillator Circuitry, that issued on June 25, 1985, as U.S. Pat. No. 4,525,790, with a priority date in Japan of Aug. 28, 1981, the same as in the present divisional application and its parent.

This invention relates to an analog-digital conversion circuit apparatus connectable to a microcomputer for measuring the electric voltage and current of a vibrator of an ultrasonic wave oscillator, which is widely used in ultrasonic machining, cleaning, cell-breaking, probing, etc.

For example, to measure consumption of electric power of an ultrasonic wave oscillator, conventionally, an expensive output meter such as a thermocouple, an analog multiplier, etc., had to be provided. Additionally, in such devices, there are so many misreadings as to measurement because an analog display with a needle was employed.

An object of this invention is to provide an analog-digital conversion circuit apparatus that is connected to a microcomputer for measuring electric voltage and current of a vibrator of an ultrasonic wave oscillator by which electric voltage and current of the vibrator is digitalized, instead of the conventional electric voltage or current circuit.

Another object of this invention is to provide an analog-digital conversion circuit apparatus for connection to a microcomputer for measuring electric voltage and current of a vibrator of an ultrasonic wave oscillator which is vibrating at sympathetic frequency thereof, or hunting to attain resonance with a changed frequency.

A further object of this invention is to provide an analog-digital conversion circuit apparatus capable of being connected to a microcomputer for measuring electric voltage and current of a vibrator of an ultrasonic wave oscillator, which is able to be used selectively either as an ammeter or a voltmeter.

Further objects and advantages of this invention will become apparent from the following description, read in connection with the accompanying drawing.

Figure 2:
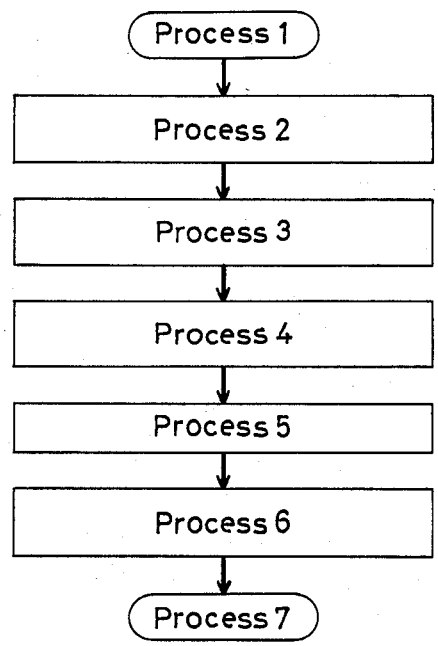

FIG. 1 is a block diagram illustrating an analog-digital conversion circuit of this invention connected to a microcomputer, and FIG. 2 is a programmatic flowchart for issuing a switching selection timing command signal from the microcomputer to the multiplexer.

An ultrasonic wave oscillator (A) provided with this invention comprises an operating unit section (B), a vibration section (C), a conversion-transmission section (D), and a microcomputer (E). In the operating unit section (B), an input analog adjusting voltage value signal ($S_1$) is regulated by a VCO (10) (Voltage Controlled Oscillator) and converted into an excitation signal ($S_2$) having a necessary oscillating frequency ($f_2$), which is further amplified by an electric power amplifier (12) into an amplified excitation signal ($S_3$). In the vibration system (C), the amplifier excitation signal ($S_3$) is transformed in voltage by a matching transformer (14), and then an ultrasonic wave vibrator (16) is excited at a resonant frequency ($f_2$), while an analog alternating high-frequency wave current value signal ($S_4$) flowing through the vibrator (16) passes through a known fixed resistance ($R_1$). In the conversion-transmission section (D), an input digital adjusting voltage value signal ($S_5$) is converted by a D/A converter (18) into the analog adjusting voltage value signal ($S_1$) which is output to the operating unit section (B). An analog direct high-frequency wave current value signal ($S_6$) into which the analog alternating high-frequency wave current value signal ($S_4$), input directly from the vibration system (C), is rectified by a rectifier (20) for conversion into a digital high-frequency wave current value signal ($S_7'$) by an A/D converter (22) on receiving a work timing command signal ($S_0$).

The microcomputer (E) has four (4) programs pre-stored in the ROM (28). They comprise Program No. 1 for detecting the initial peak current value signal ($S_7'$); Program No. 2 for automatically tracking changes in the oscillating frequency ($f_1$) by detecting the reduction of the digital high-frequency wave current value ($S_7'$); Program No. 3 for timer function to issue an oscillator stop command signal ($S_9$), and Program No. 4 for interruption to issue a switching selection timing signal ($S_{10}$) from the microcomputer (E).

In the microcomputer (E), the digital high-frequency wave current value signal ($S_7'$) consecutively input from the conversion-transmission section (D) is memorized through a digital interface (24) in a necessary address (26-1 or 26-2) of a RAM (Random Access Memory) (26), and processed comparatively and calculatingly through a CPU (Central Processing Unit) (30) in accordance with an operation order by programs the same as programs No. 1 and 2 in the above referenced companion U.S. Pat. No. 4,525,790, pre-memorized in a ROM (Read Only Memory) (28). Accordingly, when a reduction of the digital high-frequency wave current value signal ($S_7'$), due to a change of the resonant frequency of the ultrasonic wave vibrator (16), is detected, the digital adjusting voltage value signal ($S_5$) is reduced correspondingly. At the same time, an acquired peak digital high-frequency wave current value signal ($S_7'$) is stored in the necessary address (26-1 or 26-2) of the RAM (26) for comparison against the monitored changes in the resonant frequency ($f_2$) of the Vibrator (16). The digital adjusting voltage value signal ($S_5$), derived from changes in the resonant frequency ($f_2$), is passed through the digital interface (24) to the conversion-transmission section (D).

The microcomputer (E) also has the timer function to stop the work of the oscillator (A) for a programming process the same as in U.S. Pat. No. 4,525,790, supra, by transmitting the oscillator stop command signal ($S_9$) to the electric power amplifier (12) of the operating unit section (B) when a value prestored in an attached digital switch (36) is counted up by the CPU (30) after storing in a necessary address (26-3) of the RAM (26) a clock pulse signal ($S_8$) from a clock pulse generator (32).

An analog-digital conversion circuit apparatus based on this invention, within the conversion-transmission section (D) of the ultrasonic wave oscillator (A), includes an analog multiplexer (34) having a connector (P) which is connected to an output terminal ($T_3$). The connector (P) switches to either an input terminal ($T_1$) of the current inspection side or an input terminal ($T_2$) of the voltage inspection side, alternately, on receipt of a switching selection timing command signal ($S_{10}$) from the microcomputer (E).

As shown in FIG. 2, the No. 4 program carries out the following processes (the program starts at an interval of one clock pulse signal ($S_8$)):

Process (1): Interruption

Process (2): Switching the analog multiplexer to the voltage inspection side ($T_2$).

Process (3): Converting the analog voltage value into the digital voltage value for storage in a designated address (26-4) of the RAM (26).

Process (4): Multiplying the current value stored in the designated address (26-2) and the voltage value stored in the designated address (26-4) of the RAM (26), along with a well known correction coefficient. Thereafter, the resulting binary value is converted into a decimal value.

Process (5): Outputing this decimal value to a digital display device (40).

Process (6): Switching the analog multiplexer (34) to the current inspection side ($T_1$).

Process (7): Return.

In the period of the interruption process, 0.25 second (Hg), (four displays within one second), if the clock pulse signal would be set at 4 Hg, when the program for 4-demultiplication is performed during the interruption, one Hg could be gained. This operation is characterized as a timer function.

Thus the ultrasonic wave vibrator (16), through which the analog alternating high-frequency wave current value signal ($S_4$) flows, is connected through the known fixed resistance ($R_1$) to the input terminal ($T_1$) of the current inspection side.

The connection point (N) between the known fixed resistances ($R_2$) and ($R_3$), which form a potential divider (38) coupled to the vibrator (16) in series, is connected to the input terminal ($T_2$) of the voltage inspection side for feeding the analog alternating high-frequency wave voltage value signal ($S_{11}$) thereto. The output terminal ($T_3$) is connected to the rectifier (20).

In the drawing, digital display equipment (40), including a luminous emitting diode (LED), is attached to the microcomputer (E) through the digital interface (24).

The foregoing concludes the construction details of the present invention. Its operation will now be discussed.

During the work of the ultrasonic wave oscillator (A), at an interval of more than one period of an analog alternating resonant high-frequency wave (voltage and current) impressed upon the ultrasonic vibrator (16), the CPU (30) emits the switching select timing command signal ($S_{10}$) through the digital interface (24) to the multiplexer (34) and the connector (P) switches to the input terminal ($T_1$) of the current inspection side, so that the analog alternating high-frequency wave current value signal ($S_4$) flows through the fixed resistance ($R_1$) and the multiplexer (34) to the rectifier (20) of the conversion-transmission section (D) for rectification.

Successively, the rectified analog direct high -frequency wave current value signal ($S_6'$), by the A/D converter (22), on receipt of the work timing command signal ($S_0$) issued by the command operation of the CPU (30) through the digital interface (24), is converted into the digital high-frequency wave current value signal ($S_7'$). This signal ($S_7'$) is memorized in the designated address (26-1) (26-2) of the RAM (26) through the digital interface (24). Then, the switching select timing command signal ($S_{10}$) dispatched by the command operation of the CPU (30) through the digital interface (24), connects the connector (P) of the analog multiplexer (34) to the input terminal ($T_2$) of the voltage inspection side promptly, so that the analog alternating high-frequency voltage value signal ($S_{11}$), which is a voltage component divided by both fixed resistances ($R_2$) and ($R_3$) after being applied to the vibrator (16), is connected through analog multiplexer (34) to the rectifier (20) of the conversion-transmission section (D) for rectification. The rectified analog direct high-frequency wave voltage value signal ($S_6''$), by the A/D converter (22), on receipt of the work timing command signal ($S_0$) issued by the command operation of the CPU (30) through the digital interface (24), is converted into the digital high-frequency wave voltage value signal ($S_7''$). This signal ($S_7''$) is memorized in the designated (26-4) address of the RAM (26) through the digital interface (24) of the microcomputer (E).

In the case of measuring electric power consumption of the vibrator (16), in accordance with well-known multiplicative formulae within the No. 4 program prestored in the ROM (28), the digital high-frequency wave current and voltage value signals ($S_7'$) ($S_7''$), which are read by the CPU (30) from both of the designated addresses (26-2) (26-4) of the RAM (26) are multiplied together, and the result is further multiplied by the corrective coefficient within the No. 4 program prememorized in the ROM (28). The acquired value is indicated by the digital display equipment (40) on command of the CPU (30). In other words, the electric power output of the ultrasonic wave vibrator (16), during the work of the ultrasonic wave oscillator (A), is always indicated digitally.

In case a switching selection timing command signal ($S_{10}$) issued from the CPU (30) through the digital interface (24) to the multiplexer (34) instructs the connector (P) to maintain connection with either the input terminal ($T_1$) or the terminal ($T_2$), then, either electric current or electric voltage being impressed upon the vibrator (16) of the vibration system (C) will pass through the conversion-transmission section (D) into the microcomputer (E) where its value will be read on the digital display equipment (40). Accordingly, this invention can be used, also, either as an ammeter or a voltmeter.

As will be apparent from the above description, when one of the various uses of the microcomputer is to measure electric power consumption of the ultrasonic vibrator, it is not necessary for this invention to employ a specific electric power meter circuit, and conventionally-used expensive thermocouple and analog multiplier, by virtue of the microcomputer. Additionally, measurement misreadings are practically eliminated. Furthermore, in case the acquired digital electric power value signal is used for succeeding processes, it is possible to enter the value into the microcomputer directly.

As is apparent from the foregoing, this invention is useful, effective and efficient when compared with conventional systems; especially, in light of its precision, no conventional system is as prominent as the present invention, or able to achieve the aims and purposes thereof, as set forth above.

What is claimed is:

1. An analog-digital conversion circuit apparatus connectable to a microcomputer for measuring electric voltage and current of a vibrator of an ultrasonic wave oscillator comprising a vibration system outputting an analog high-frequency wave voltage value signal and an analog high-frequency wave current value signal which acquired from an ultrasonic wave vibrator, and a conversion-transmission section outputting alternately to said microcomputer a digital high-frequency wave voltage value signal and a digital high frequency wave current value signal, said signal being converted by an analog-digital conversion after receiving said analog high-frequency wave voltage value signal and said analog high-frequency wave current value signal alternately from said vibration system in response to a switching select timing command signal, said microcomputer further outputting said select timing command signal, said vibration system including a voltage inspection side and current inspection side, which are connected respectively through known fixed resistances and a potential divider to a conversion-transmission section, said conversion-transmission section comprising an analog multiplexer inputting said analog alternating high-frequency wave voltage value signal and said analog alternating high-frequency wave current value signal alternately from said vibration system on receipt of said switching select timing command signal from said microcomputer, a rectifier rectifying said analog alternating high-frequency wave voltage value signal and said analog alternating high-frequency wave current value signal for getting an analog direct high-frequency wave voltage value signal and an analog direct high-frequency wave current value signal, and an A/D converter converting said analog high-frequency wave direct current value signal and said analog direct high-frequency wave voltage value signal into said digital high-frequency wave current value signal and said digital high-frequency wave voltage value signal for output.

2. An analog-digital conversion circuit apparatus connectable to a microcomputer for measuring electric voltage and current of a vibrator of an ultrasonic wave oscillator, comprising:

a vibration system including an ultrasonic wave vibrator outputting an analog alternating high-frequency wave voltage value signal and an analog alternating high-frequency wave current value signal;

a microcomputer;

a conversion-transmission section including an analog-digital converter for converting said analog signals, respectively, to digital signals for alternate transmission to said microcomputer;

said vibration system further including a voltage inspection side, and a current inspection side, connected, respectively, through known fixed resistances and a potential divider, to said conversion-transmission section;

multiplexer for switching said analog signals, alternately, from said voltage inspection side to said current inspection side, and vice versa, in response to a timing command signal;

means associated with said microcomputer to issue said timing command signals to which the switching function of said multiplexer responds;

a rectifier rectifying said analog signals to direct voltage and direct current high-frequency wave value signals, respectively, for transmission to said analog-digital converter, which converts said analog direct high-frequency wave voltage and current value signals into their digital counterparts, respectively.

* * * * *